(12) United States Patent
Trobough et al.

(10) Patent No.: US 6,347,946 B1
(45) Date of Patent: Feb. 19, 2002

(54) PIN GRID ARRAY SOCKET

(75) Inventors: Mark B. Trobough, Olympia; Michael J. Baker, DuPont, both of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/708,798

(22) Filed: Nov. 8, 2000

(51) Int. Cl.[7] .................................................. H01R 12/00
(52) U.S. Cl. ........................ 439/70; 439/342; 361/790
(58) Field of Search ............................ 439/70, 71, 342, 439/912; 361/754, 755, 760, 761, 765, 790

(56) References Cited

U.S. PATENT DOCUMENTS

| | | | | |
|---|---|---|---|---|
| 4,084,869 A | * | 4/1978 | Yen | 439/70 |
| 4,912,401 A | * | 3/1990 | Nady, II et al. | 324/158 |
| 5,092,789 A | * | 3/1992 | Sinclair | 439/259 |
| 5,460,531 A | * | 10/1995 | Vivio | 439/70 |
| 5,672,981 A | * | 9/1997 | Fehrman | 324/760 |
| 5,859,538 A | * | 1/1999 | Self | 324/755 |
| 5,880,590 A | * | 3/1999 | Desai et al. | 324/757 |
| 5,982,635 A | * | 11/1999 | Menzies et al. | 361/790 |
| 6,200,143 B1 | * | 3/2001 | Haba et al. | 439/70 |

* cited by examiner

*Primary Examiner*—Tulsidas Patel
(74) *Attorney, Agent, or Firm*—Schwegman, Lundberg, Woessner & Kluth, P.A.

(57) ABSTRACT

A socket includes a mechanism to gain electrical access to integrated circuit package pins in an end-user system. A pin grid array (PGA) socket includes signal traces that lead to a connector accessible by test equipment. In one embodiment, the PGA socket is a zero insertion force (ZIF) socket, and in other embodiments, the PGA socket is a low insertion force (LIF) socket. In other embodiments, multiple PGA sockets are interconnected.

23 Claims, 3 Drawing Sheets

PIN GRID ARRAY SOCKET

FIELD

The present invention relates generally to sockets that accept packaged integrated circuits, and more specifically to sockets that accept pin grid array packages.

BACKGROUND

As integrated circuits become larger and faster, they also become harder to test and debug in end-user systems. When an end-user system is undergoing debug, it can be convenient to monitor electrical signals on integrated circuit package pins. Modem integrated circuit packages, however, often have pins numbered in the hundreds or thousands, and gaining physical or electrical access to pins can be difficult. One known mechanism for gaining access to integrated circuit package pins in an end-user system includes the use of an interposer beneath the integrated circuit. One such interposer is shown in FIG. 1.

FIG. 1 shows a side view of an interposer between an integrated circuit package and a socket. Socket 104 is attached to printed circuit board (PCB) 106, interposer 122 is attached to socket 104, and integrated circuit package 102 is attached to interposer 122. Interposer 122 is included between integrated circuit package 102 and socket 104 to facilitate testing and debug. Typically, interposer 122 includes signal traces coupled to the pins of integrated circuit package 102. The signal traces are brought out away from the rest of the assembly to allow access by test equipment such as logic analyzers and oscilloscopes.

Socket 104 is typically a zero insertion force (ZIF) socket or a low insertion force (LIF) socket such as those available from the AMP division of Tyco International Inc., and from Foxconn Electronics Inc.

In the assembly shown in FIG. 1, with interposer 122 in place, integrated circuit package 102 is distance 108 from PCB 106. A portion of this distance is attributable to the height of interposer 122. When interposer 122 is not in place, integrated circuit package 102 is coupled directly to either socket 104 or PCB 106. It can be seen that the addition of interposer 122 increases the distance between integrated circuit package 102 and PCB 106. This increased distance influences the length of signal lines, and also causes integrated circuit package 102 to protrude further from PCB 106. In very high speed systems, it can be detrimental to signal quality to increase the length of signal lines, and in some mechanically crowded systems, it may not be possible to allow integrated circuit package 102 to protrude far from PCB 106.

For the reasons stated above, and for other reasons stated below which will become apparent to those skilled in the art upon reading and understanding the present specification, there is a need in the art for improved mechanisms to access integrated circuit package pins.

DESCRIPTION OF EMBODIMENTS

Figure 1:
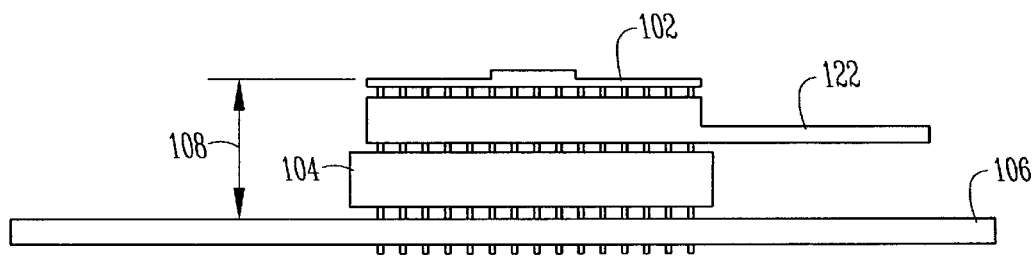
FIG. 1 is a side view of a prior art interposer between an integrated circuit package and a socket.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to gain electrical access to integrated circuit package pins in an end-user system. A pin grid array (PGA) socket includes signal traces that lead to a connector accessible by test equipment. In one embodiment, the PGA socket is a zero insertion force (ZIF) socket, and in other embodiments, the PGA socket is a low insertion force (LIF) socket. In other embodiments, multiple PGA sockets are interconnected.

Figure 2A:
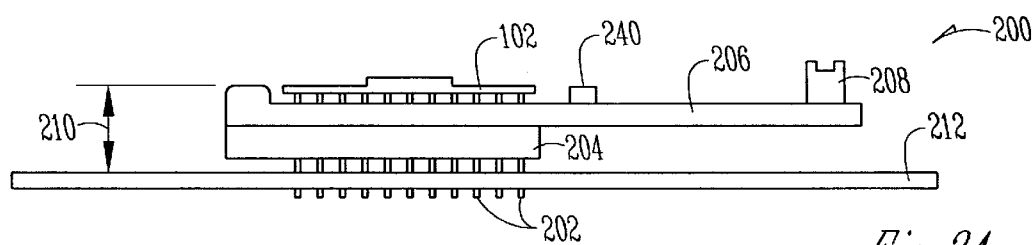
FIG. 2A is a side view of a socket and an integrated circuit package coupled to an printed circuit board.

FIG. 2A is a side view of a socket and an integrated circuit package coupled to a printed circuit board. Integrated circuit package 102 is coupled to a ZIF socket that includes top portion 206 and bottom portion 204. Top portion 206 is larger than bottom portion 204 in at least one dimension. One end of top portion 206 is over bottom portion 204, and the other end of top portion 206 includes connector 208. Top portion 206 includes signal traces that electrically couple to the pins of integrated circuit package 102, and bring electrical signals from integrated circuit 102 to connector 208. A test system can attach to the socket at connector 208 and monitor signals from pins on integrated circuit package 102. Socket pins 202 are received by PCB 212 to couple integrated circuit package 102 to a system. For example, in some embodiments, integrated circuit package 102 includes a processor and PCB 212 is a motherboard.

The configuration of system 200 provides a distance 210 between PCB 212 and integrated circuit package 102. Because an interposer is not included between the socket and the integrated circuit package, distance 210 can be kept small, and electrical loading on signals as a result of distance 210 can also be kept small. In some embodiments, top portion 206 also includes circuit element 240 to help reduce electrical loading. One embodiment of circuit element 240 is shown and described in more detail with reference to FIG. 7 below.

In some embodiments, bottom portion 204 is made of a molded material such as plastic, and top portion 206 is made of an organic material such as glass epoxy, flexible circuit board, rigid flex circuit board, or molded circuit board. In these embodiments, bottom portion 204 can be manufactured using methods currently in use for manufacturing bottom portions of ZIF sockets, and top portion 206 can be manufactured using methods currently in use for manufacturing glass epoxy, flexible, rigid flex, or molded circuit boards.

Connector 208 is shown in FIG. 2A as a connector mounted to top portion 206. In some embodiments, connector 208 is an edge connector, and in other embodiments, top portion 206 includes a cable terminating point, and a cable is directly attached to top portion 206.

In operation, top portion 206 and bottom portion 204 slide relative to each other to engage the integrated circuit package pins. When top portion 206 is slid in one direction, the integrated circuit pins are accepted into holes in both top portion 206 and bottom portion 204. When top portion 206 is slid in the other direction, the pins are pinched and the integrated circuit package is held in place. This operation is described in further detail with reference to FIGS. 3A and 3B below.

Figure 2B:
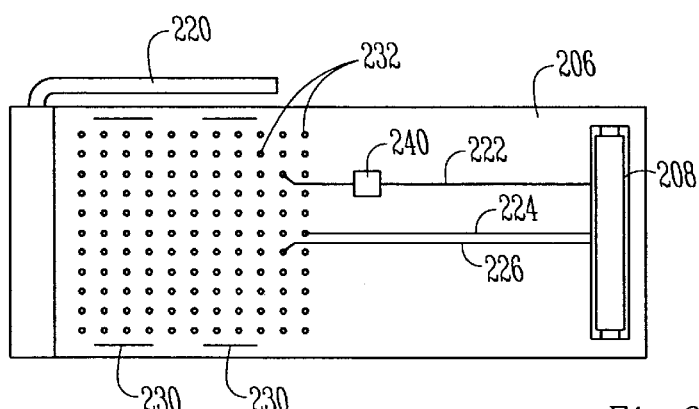
FIG. 2B is a top view of the socket of FIG. 2A.

FIG. 2B is a top view of the socket of FIG. 2A. Top portion 206 is shown having an array of holes 232. Holes 232 are arranged to accept pins from an integrated circuit package, such as integrated circuit package 102 (FIG. 2A). Also shown on top portion 206 are signal traces 222, 224, and 226 coupled between holes 232 and connector 208. In some embodiments, a signal trace from each hole 232 is coupled to connector 208. In other embodiments, a subset of holes 232 is coupled to connector 208 by signal traces. Top portion 206 can have any number of layers useful for routing and shielding signal traces.

Circuit 240 includes circuit elements to help isolate the electrical effects of trace 222 from the integrated circuit package pin to which it is connected. Circuit 240 also helps to isolate the integrated circuit package pin from electrical effects of anything connected to trace 222, such as test equipment probes. In some embodiments, circuit 240 includes only passive components such as resistors and capacitors, and in other embodiments, circuit 240 includes active components, such as a signal receiver with a high input impedance. Circuit 240 can be on a surface of top portion 206 as shown in FIG. 2B, or can be embedded within top portion 206 to allow closer proximity to integrated circuit package pins.

Top portion 206 is slidingly attached to bottom portion 204 in a manner known in the art of ZIF connectors. In the embodiment shown in FIG. 2B, slots 230 in top portion 206 accept elongated members attached to bottom portion 204, and cam arm 220, when actuated, causes top portion 206 to slide relative to bottom portion 204. As top portion 206 slides relative to bottom portion 204, slots 230 slide along the members attached to bottom portion 204. Many possible mechanisms can be used to slidingly attach top portion 206 and bottom portion 204 without departing from the scope of the present invention.

Figure 3A:
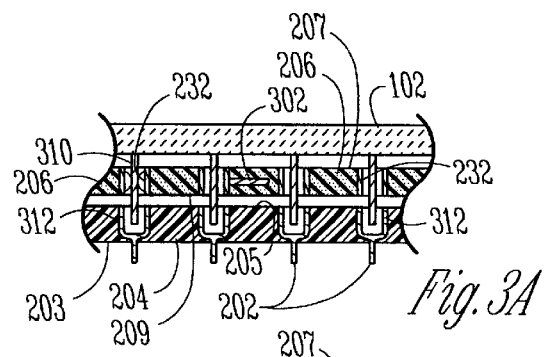
FIGS. 3A and 3B are partial cross-sectional views of the socket and integrated circuit package of FIG. 2A.
Figure 3B:
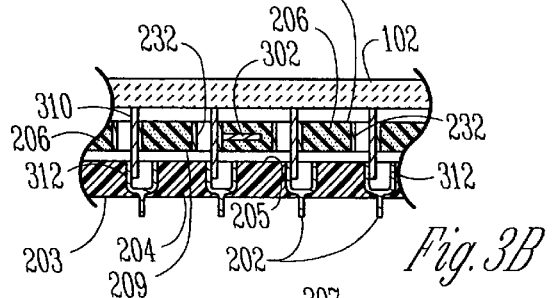

FIGS. 3A and 3B are partial cross-sectional views of the socket and integrated circuit package of FIG. 2A. In FIG. 3A, cross sections of top portion 206 and bottom portion 204 are shown. The cross-section is taken on a line that intersects a row of holes 232, and top portion 206 is shown as a series of rectangles. Bottom portion 204 is shown beneath top portion 206, oriented such that pins 310 from integrated circuit package 102 can freely pass through holes 232 and enter cavities in bottom portion 204.

Top portion 206 includes substantially parallel top face 207 and bottom face 209. Bottom portion 204 includes substantially parallel top face 205 and bottom face 203. Bottom face 209 of top portion 206 and top face of bottom portion 204 face each other, and slide relative to each other when the socket is operated.

Top portion 206 includes trace 302. Trace 302 is routed within top portion 206 to a connector such as connector 208 (FIG. 2A). In some embodiments, the routing of trace 302 is substantially perpendicular to the direction of holes 232, and to the orientation of any integrated circuit package pins received thereby. Trace 302 includes a conductor that is at least partially exposed in a hole 232 in top portion 206 so as to make electrical contact with an integrated circuit package pin 310. In the embodiment of FIG. 3A, holes 232 are plated-through holes, and the integrated circuit package pins make contact with signal traces through the metal in the plated-through holes.

FIG. 3B shows the same cross section as FIG. 3A, but with top portion 206 slid relative to bottom portion 204 so as to pinch integrated circuit package pins 310. Integrated circuit package pins 310 are pinched to make electrical contact with plated-through holes 232 and conductors 312. As shown in FIG. 3B, conductor 312 lines the cavity in bottom portion 204, and provides a conductive path to pin 202.

Figure 3C:
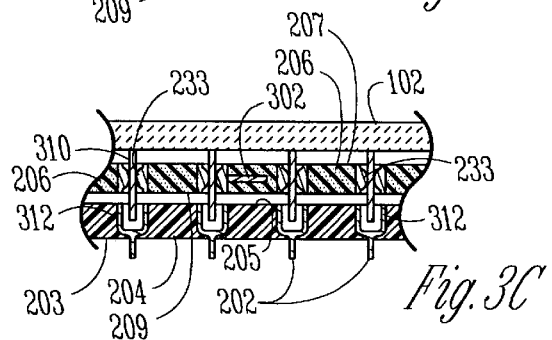
FIG. 3C shows a partial cross-sectional view of another embodiment of the socket and integrated circuit package of FIG. 2A.

FIG. 3C shows an embodiment having an interference fit between integrated circuit package pins 310 and the holes 232 in top portion 206. Holes 232 include contact points that electrically contact pins 310 as they pass through. The contact points can take any shape. For example, the hole can be drilled as a series of holes such that a top view of the hole is clover leaf pattern (not shown), or the hole can be round with an annular protrusion to contact the pin as shown in FIG. 3C. In the embodiments shown in FIG. 3C, contact is made between pins 310 and conductors 312 in the same manner as in FIG. 3B. Top portion 206 and bottom portion 204 are slid relative to each other so pins 310 contact conductors 312.

The embodiments described thus far include a zero insertion force (ZIF) socket having a top portion capable of routing signals away from an integrated circuit without creating an undue electrical or mechanical burden on the system. A socket receiving device, such as a motherboard in a system, receives the ZIF socket which in turn receives an integrated circuit.

Figure 4A:
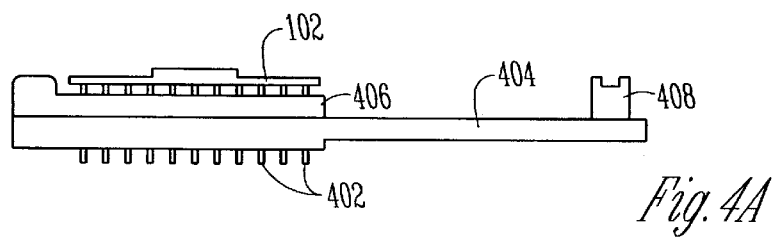
FIG. 4A is a side view of an alternate socket and integrated circuit package.

FIG. 4A is a side view of an alternate socket and integrated circuit package. The socket of FIG. 4A includes top portion 406 and bottom portion 404 slidingly coupled together. Top portion 406 includes holes through which pins 310 from integrated circuit package 102 can pass. Bottom portion 404 is larger than top portion 406 in at least one dimension, and includes connector 408 on one end. The ZIF socket of FIG. 4A is like the ZIF socket of FIG. 2A except the elongated portion that includes signal traces is part of the bottom portion rather than the top portion. Top portion can be manufactured from a molded material such as plastic, and bottom portion can be manufactured from a material suitable for printed circuit boards, such as glass epoxy circuit boards, flexible circuit boards, rigid flex circuit boards or molded circuit boards.

Bottom portion 404 is shown having pins 402 to couple to a socket receiving device such as a motherboard. Bottom portion 404 can include other types of electrical attachment points for coupling to a socket receiving device without departing from the scope of the present invention. For example, rather than pins 402, bottom portion 404 can include bumps arranged in a ball grid array (BGA) pattern.

Figure 4B:
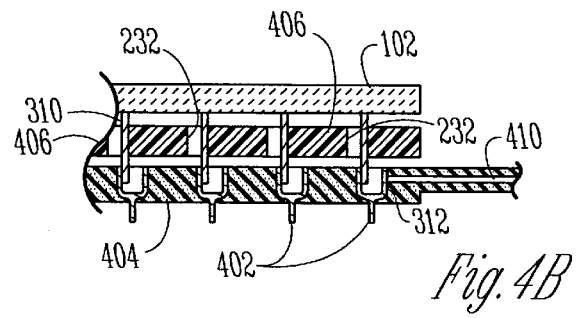
FIG. 4B is a partial cross-sectional view of the socket and integrated circuit package of FIG. 4A.

FIG. 4B shows a partial cross-sectional view of the integrated circuit package and socket of FIG. 4A. Top portion 406 includes holes 232 through which integrated circuit package pins 310 can pass. Bottom portion 410 includes signal trace 410 coupled to conductor 312. The ZIF socket of FIG. 4B is shown with the top portion slid relative to the bottom portion such that the integrated circuit package pins are pinched to maintain mechanical and electrical contact.

Figure 5A:
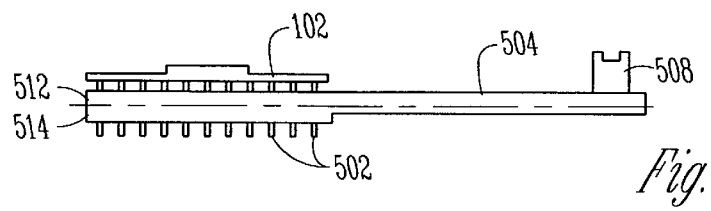
FIG. 5A is a side view of another alternate socket and integrated circuit package.

FIG. 5A is a side view of another alternate socket and integrated circuit package. Socket 504 includes a top portion 512 and bottom portion 514 rigidly affixed to one another. In some embodiments, socket 504 is a low insertion force (LIF) socket. Socket 504 includes signal traces to carry signals between integrated circuit package 102 and connector 508.

Figure 5B:
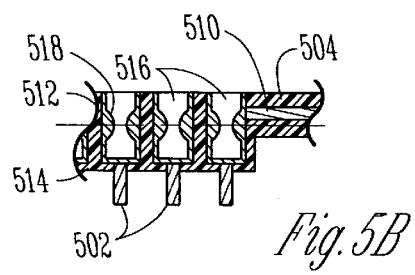
FIG. 5B is a partial cross-sectional view of the socket of FIG. 5A.

FIG. 5B is a partial cross-sectional view of the socket of FIG. 5A. Socket 504 includes top portion 512 and bottom portion 514. Holes 516 are arranged in socket 504 to accept integrated circuit package pins. Low insertion force contacts 518 are arranged within holes 516. Signal trace 510 makes electrical contact with at least one of the low insertion force contacts 518. In the embodiment of FIG. 5B, signal trace 510 is shown in top portion 512, but this is not a limitation of the present invention. In other embodiments, signal traces are in bottom portion 514.

In some embodiments, socket 504 is manufactured as two separate pieces: top portion 512, and bottom portion 514, that are then rigidly affixed to each other. In other embodiments, socket 504 is manufactured as a single unit. Socket 504 can be manufactured from any material suitable to accept signal traces. For example, socket 504 can be manufactured using glass epoxy materials using manufacturing methods known in the art of printed circuit board manufacturing. Socket 504 can also be manufactured using materials for flexible circuit boards, rigid flex circuit boards, molded circuit boards, or the like.

Figure 6:
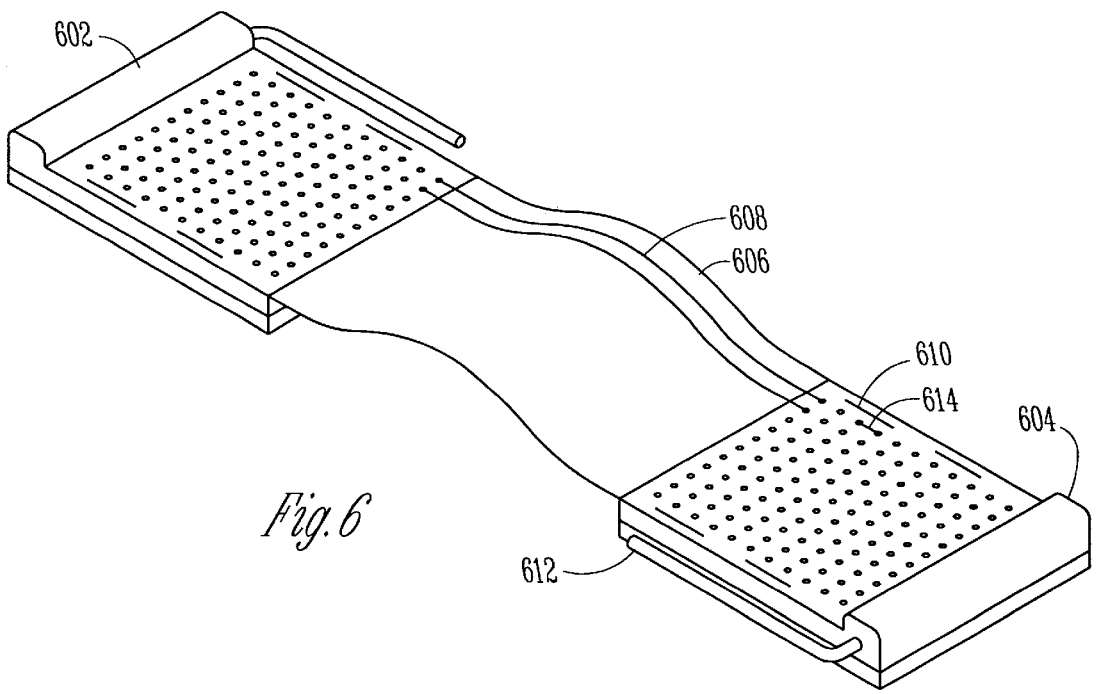
FIG. 6 is a perspective view of two sockets interconnected.

FIG. 6 is a perspective view of two sockets interconnected. Sockets 602 and 604 are ZIF sockets interconnected by membrane 606. In some embodiments, membrane 606 is a flexible membrane, and in other embodiments, membrane 606 is a rigid membrane. Example materials useful for membrane 606 include glass epoxy, flexible circuit board, and rigid flex circuit board. Membrane 606 includes signal traces 608 electrically coupling holes on sockets 602 and 604. Sockets 602 and 604 are shown as ZIF sockets, but can be any socket embodiment of the present invention, including embodiments described with reference to previous figures. Socket 604 is shown with cam arm 612 and slots 610 to allow top and bottom portions of the socket to slide relative to each other.

In some embodiments, the top portions of sockets 602 and 604 are made of glass epoxy, and membrane 606 is attached to the top portions of sockets 602 and 604 using known mechanisms. In other embodiments, membrane 606 is coupled between bottom portions of sockets 602 and 604.

Signal trace 614 on socket 604 electrically couples two holes on socket 604. The method and apparatus of the present invention can be utilized to couple two integrated circuit packages together, as well as coupling pins from individual sockets to other pins. In this manner, integrated circuit package pins can be coupled to other pins of the same package, to pins of another integrated circuit package, and to test equipment.

Figure 7:
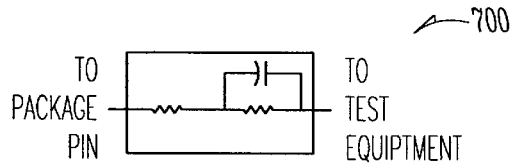
FIG. 7 shows a diagram of an isolation circuit.

FIG. 7 shows a diagram of an isolation circuit. Isolation circuit 700 is a circuit that can be included in a socket to reduce electrical loading. For example, isolation circuit 700 can be used as isolation circuit 240 (FIG. 2B) to allow signals to be routed to connector 208, and coupled to other circuits, without undue electrical loading on pins of integrated circuit package 102. In some embodiments, isolation circuit 700 includes active circuitry, such as receivers having high input impedance.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising:
   a bottom portion having a plurality of electrical attachment points to contact integrated circuit package pins; and
   a top portion having a plurality of holes to accept the integrated circuit package pins, the top portion including at least one signal trace exposed in at least one of the plurality of holes such that electrical contact can be made with at least one of the integrated circuit package pins;
   wherein the top portion is slidingly attached to the bottom portion such that the at least one signal trace can electrically contact the at least one of the integrated circuit package pins when the top portion slides.

2. The apparatus of claim 1 wherein the top portion comprises an organic material.

3. The apparatus of claim 2 wherein the at least one of the plurality of holes is a plated-through hole.

4. The apparatus of claim 2 wherein the at least one signal trace is routed to contact more than one of the integrated circuit package pins.

5. The apparatus of claim 1 wherein the top portion comprises passive circuits to reduce electrical loading on the integrated circuit package pins.

6. The apparatus of claim 1 wherein the top portion comprises active circuits to reduce electrical loading on the integrated circuit package pins.

7. The apparatus of claim 1 wherein the plurality of holes in the top portion are shaped to provide an interference fit with the integrated circuit package pins.

8. The apparatus of claim 1 wherein the at least one signal trace is routed to contact more than one of the integrated circuit package pins.

9. A zero insertion force socket comprising;
   a bottom portion having a top face and a bottom face, the bottom face being substantially parallel to the top face, the bottom portion including conductive paths to make electrical contact between integrated circuit package pins and a socket receiving device; and
   an top portion having a bottom face slidingly coupled to the top face of the bottom portion, the top portion including a plurality of holes through which the integrated circuit package pins can pass;
   wherein the zero insertion force socket includes a plurality of signal traces to electrically couple integrated circuit package pins to a device other than the socket receiving device.

10. The zero insertion force socket of claim 9 wherein the top portion includes the plurality of signal traces, and each of the plurality of signal traces includes a conductor exposed in at least one of the plurality of holes.

11. The zero insertion force socket of claim 10 wherein the top portion comprises an organic material.

12. The zero insertion force socket of claim 11 wherein the plurality of holes are plated-through holes.

13. The zero insertion force socket of claim 10 wherein the signal traces couple multiple holes together.

14. The zero insertion force socket of claim 10 wherein the top portion is larger than the bottom portion, the top portion further comprising a cable terminating point coupled to the plurality of signal traces.

15. The zero insertion force socket of claim 14 further comprising passive circuit devices on the top portion to reduce electrical loading on the integrated circuit package pins.

16. The zero insertion force socket of claim 10 wherein the top portion is coupled to a flex circuit to carry the signal traces away from the top portion.

17. The zero insertion force socket of claim 9 wherein the bottom portion includes the plurality of signal traces, and each of the plurality of signal traces includes a conductor electrically coupled to at least one of the conductive paths.

18. A pin grid array socket comprising:

a bottom portion having a plurality of electrical attachment points to contact integrated circuit package pins, the plurality of electrical attachment points being configured to attach to a socket receiving device, the bottom portion including at least one signal trace electrically coupled to at least one of the plurality of electrical attachment points such that electrical contact can be made with at least one of the integrated circuit package pins; and a top portion having a plurality of holes to accept the integrated circuit package pins;

wherein the top portion is slidingly attached to the bottom portion such that the at least one signal trace can electrically contact the at least one of the integrated circuit package pins when the top portion slides.

19. The pin grid array socket of claim 18 wherein the bottom portion comprises an organic material.

20. The pin grid array socket of claim 18 wherein the at least one signal trace is routed to contact more than one of the integrated circuit package pins.

21. The pin grid array socket of claim 18 wherein the bottom portion is larger than the top portion, the bottom portion further comprising a cable terminating point coupled to the plurality of signal traces.

22. The pin grid array socket of claim 21 further comprising circuit devices on the bottom portion to reduce electrical loading on the integrated circuit package pins.

23. The pin grid array socket of claim 18 wherein the bottom portion is coupled to a flex circuit to carry the signal traces away from the bottom portion.

* * * * *

UNITED STATES PATENT AND TRADEMARK OFFICE
CERTIFICATE OF CORRECTION

PATENT NO. : 6,347,946 B1
DATED : February 19, 2002
INVENTOR(S) : Trobough et al.

It is certified that error appears in the above-identified patent and that said Letters Patent is hereby corrected as shown below:

Column 5,
Line 29, delete "arc" and insert -- are --, therefor.
Line 32, delete "arc" and insert -- are --, therefor.

Signed and Sealed this

Twenty-third Day of April, 2002

Attest:

JAMES E. ROGAN
Attesting Officer     Director of the United States Patent and Trademark Office